(12) United States Patent
Yaegashi

(10) Patent No.: US 8,330,203 B2
(45) Date of Patent: Dec. 11, 2012

(54) NONVOLATILE SEMICONDUCTOR MEMORY DEVICE IN WHICH DECREASE IN COUPLING RATIO OF MEMORY CELLS IS SUPPRESSED

(75) Inventor: Toshitake Yaegashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

(21) Appl. No.: 12/507,473

(22) Filed: Jul. 22, 2009

(65) Prior Publication Data

US 2009/0278184 A1    Nov. 12, 2009

Related U.S. Application Data

(62) Division of application No. 11/625,055, filed on Jan. 19, 2007, now abandoned.

(30) Foreign Application Priority Data

Jan. 31, 2006   (JP) ................................. 2006-023850

(51) Int. Cl.
*H01L 29/76* (2006.01)
*H01L 29/788* (2006.01)

(52) U.S. Cl. ........ 257/315; 257/316; 257/317; 257/320; 257/E29.3

(58) Field of Classification Search .......... 257/314–317, 257/E29.3, 319–320
See application file for complete search history.

(56) References Cited

U.S. PATENT DOCUMENTS

| | | | |
|---|---|---|---|
| 6,211,548 B1 | 4/2001 | Ma | |
| 6,987,046 B2* | 1/2006 | Yang et al. | 438/257 |
| 7,288,813 B2* | 10/2007 | Tsunoda et al. | 257/316 |
| 2002/0070402 A1 | 6/2002 | Ichige et al. | |
| 2002/0072167 A1 | 6/2002 | Lee et al. | |
| 2003/0132471 A1 | 7/2003 | Matsui et al. | |
| 2005/0093080 A1 | 5/2005 | Kitamura et al. | |
| 2005/0104120 A1 | 5/2005 | Ichige et al. | |
| 2005/0258463 A1* | 11/2005 | Yaegashi et al. | 257/296 |
| 2008/0179654 A1 | 7/2008 | Sato et al. | |
| 2009/0047777 A1 | 2/2009 | Nagano | |

FOREIGN PATENT DOCUMENTS

| | | |
|---|---|---|
| JP | 7-183411 | 7/1995 |
| JP | 2000-232169 | 8/2000 |
| JP | 2000-311992 | 11/2000 |
| JP | 2003-78047 | 3/2003 |
| JP | 2006-24738 | 1/2006 |
| KR | 2001-0107777 | 12/2001 |
| KR | 2003-0002467 | 1/2003 |
| KR | 10-2005-0069184 | 7/2005 |

OTHER PUBLICATIONS

Office Action issued Nov. 30, 2010, in Japanese Patent Application No. 2006-023850 with English translation.

* cited by examiner

*Primary Examiner* — Shouxiang Hu

(74) *Attorney, Agent, or Firm* — Oblon, Spivak, McClelland, Maier & Neustadt, L.L.P.

(57) ABSTRACT

A first insulation film is formed on a semiconductor substrate. A first gate electrode is formed on the first insulation film. A second insulation film is formed on an upper surface and a side surface of the first gate electrode. A second gate electrode is formed on the second insulation film. The entirety of that part of the second gate electrode, which is located above the second insulation film formed on the upper surface of the first gate electrode, is a silicide layer. At least a portion of that part of the second gate electrode, which is located on the side surface of the first gate electrode, is a silicon layer.

13 Claims, 17 Drawing Sheets

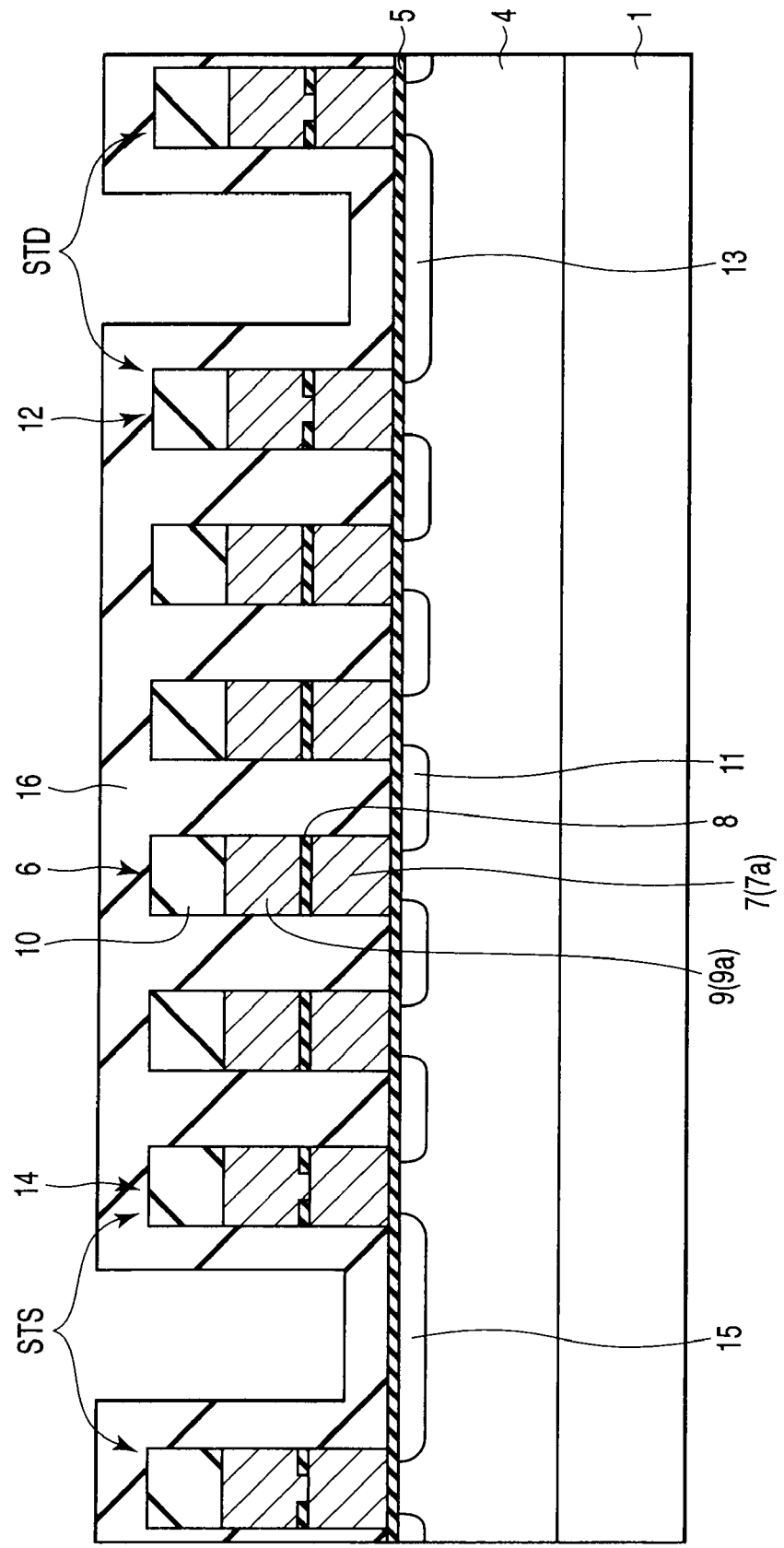
F I G. 8

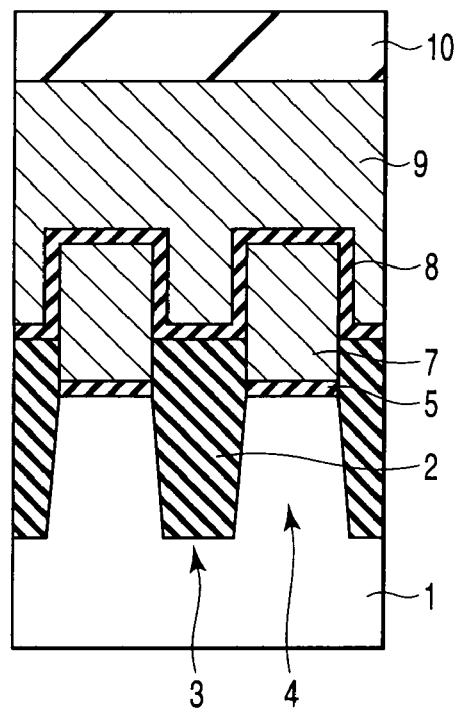
F I G. 11
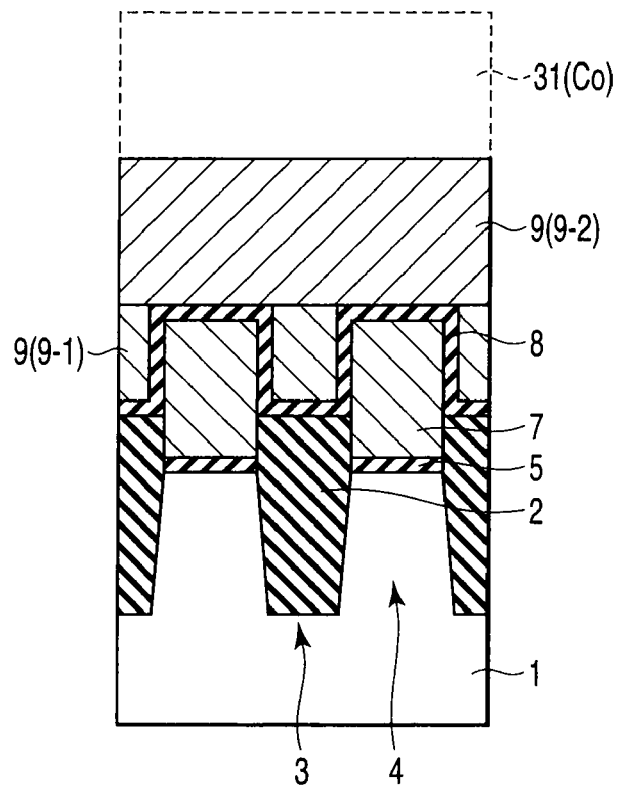
F I G. 13

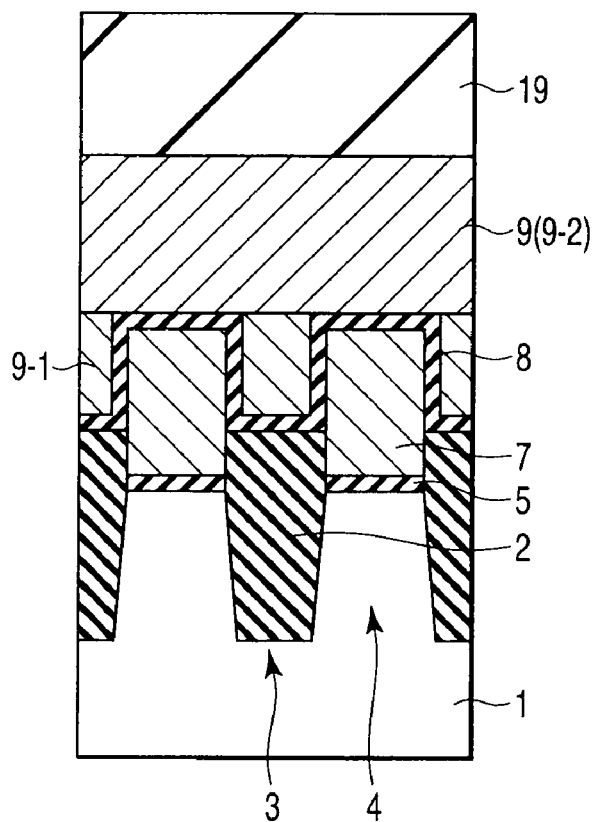
F I G. 15
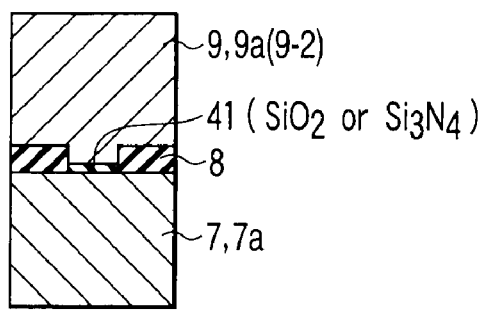
F I G. 16 A
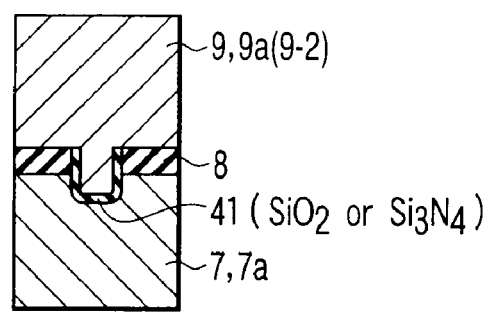
F I G. 16 B

NONVOLATILE SEMICONDUCTOR MEMORY DEVICE IN WHICH DECREASE IN COUPLING RATIO OF MEMORY CELLS IS SUPPRESSED

CROSS-REFERENCE TO RELATED APPLICATIONS

This application is a divisional of U.S. application Ser. No. 11/625,055 filed Jan. 19, 2007 and is based upon and claims the benefit of priority from prior Japanese Patent Application No. 2006-023850, filed Jan. 31, 2006, the entire contents of each of which are incorporated herein by reference.

BACKGROUND OF THE INVENTION

1. Field of the Invention

The present invention relates to, for example, a nonvolatile semiconductor memory device having a stacked gate comprising a floating gate and a control gate.

2. Description of the Related Art

A NAND-type nonvolatile semiconductor memory device is known as an example of a nonvolatile semiconductor memory device having a stacked gate. The NAND-type nonvolatile semiconductor memory device comprises a plurality of series-connected memory cells, and selection transistors which are connected to a drain side and a source side of the series-connected memory cells. A bit line contact electrode, which is electrically connected to a bit line, and a source line contact electrode, which is electrically connected to a source line, are arranged in the vicinity of the selection transistors.

The gate electrode of each memory cell has a stacked gate electrode structure comprising a floating gate electrode and a control gate electrode which is formed on the floating gate electrode via an inter-gate insulation film. The gate electrode of the selection transistor has a structure similar to the structure of the gate electrode of the memory cell. However, a part of the inter-gate insulation film is removed, and the floating gate electrode and the control gate electrode are electrically connected.

To reduce the resistance of the control gate electrode, an upper part of the control gate electrode is formed of a silicide layer and a lower part of the control gate electrode is formed of a silicon layer (see, e.g., Jpn. Pat. Appln. KOKAI Publication No. 2000-311992). A similar structure is applied to the selection transistor, and a silicide layer is formed at the upper part of the gate electrode thereof. In addition, a lower part of the gate electrode is formed of a silicon layer, and that part of the gate electrode, which is in contact with the gate insulation film, is a silicon layer.

However, in the case where only the upper part of the control gate electrode is silicided and the silicon layer is left above the upper part of the floating gate electrode, a depletion layer occurs in the control gate electrode. Consequently, the capacitance of the inter-gate insulation film decreases by a degree corresponding to the depletion layer. Thus, such a problem arises that the coupling ratio of memory cells decreases and the characteristics of memory cells deteriorate. Accordingly, a nonvolatile semiconductor memory device has been desired which can suppress a decrease in coupling ratio of memory cells, and improving the characteristics of memory cells.

BRIEF SUMMARY OF THE INVENTION

According to a first aspect of the present invention, there is provided a nonvolatile semiconductor memory device comprising: a semiconductor substrate; a first insulation film formed on the semiconductor substrate; a first gate electrode formed on the first insulation film; a second insulation film formed on an upper surface and a side surface of the first gate electrode; and a second gate electrode formed on the second insulation film, wherein an entirety of a part of the second gate electrode, which is located above the second insulation film formed on the upper surface of the first gate electrode, is a silicide layer, and at least a portion of a part of the second gate electrode, which is located on the side surface of the first gate electrode, is a silicon layer.

According to a second aspect of the present invention, there is provided a nonvolatile semiconductor memory device comprising: a semiconductor substrate; a memory cell including a first insulation film formed on the semiconductor substrate, a first gate electrode formed on the first insulation film, a second insulation film formed on an upper surface and a side surface of the first gate electrode, and a second gate electrode formed on the second insulation film; and a selection transistor including a third gate electrode formed on the semiconductor substrate via the first insulation film, wherein an entirety of a part of the second gate electrode, which is located above the second insulation film formed on the upper surface of the first gate electrode, is a silicide layer, and a part of the third gate electrode, which is in contact with the first insulation film, is a silicon layer.

According to a third aspect of the present invention, there is provided a nonvolatile semiconductor memory device comprising: a semiconductor substrate; a memory cell including a first insulation film formed on the semiconductor substrate, a first gate electrode formed on the first insulation film, a second insulation film formed on an upper surface and a side surface of the first gate electrode, and a second gate electrode formed on the second insulation film; and a selection transistor including a third gate electrode formed on the semiconductor substrate via the first insulation film, wherein an entirety of a part of the second gate electrode, which is located above the second insulation film formed on the upper surface of the first gate electrode, is a silicide layer, and at least a portion of a part of the second gate electrode, which is located on the side surface of the first gate electrode, and a part of the third gate electrode, which is in contact with the first insulation film, are silicon layers.

BRIEF DESCRIPTION OF THE SEVERAL VIEWS OF THE DRAWING

FIG. 8 is a cross-sectional view illustrating a manufacturing step following the manufacturing step in FIG. 6;

FIG. 11 is a cross-sectional view illustrating a manufacturing step following the manufacturing step in FIG. 9;

FIG. 13 is a cross-sectional view illustrating a manufacturing step following the manufacturing step in FIG. 11;

FIG. 15 is a cross-sectional view illustrating a manufacturing step following the manufacturing step in FIG. 13;

FIG. 16A and FIG. 16B are cross-sectional views showing other examples of the gate electrode of the drain-side/source-side selection transistor;

DETAILED DESCRIPTION OF THE INVENTION

Embodiments of the present invention will now be described with reference to the accompanying drawings.
(First Embodiment)

Figure 1:
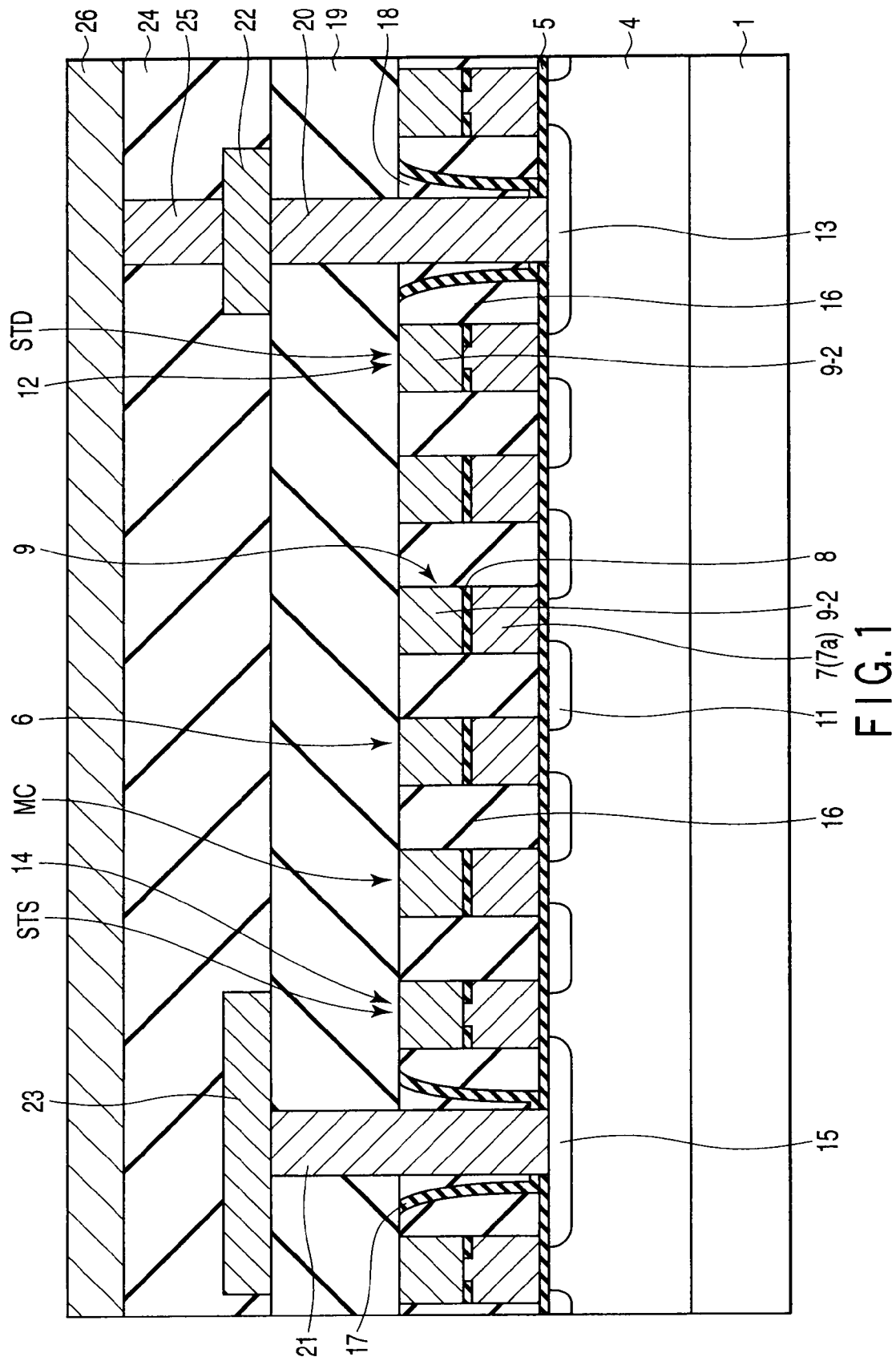
FIG. 1 shows a NAND-type nonvolatile semiconductor memory device according to a first embodiment of the invention, FIG. 1 being a cross-sectional view taken along line I-I in FIG. 2.
Figure 2:
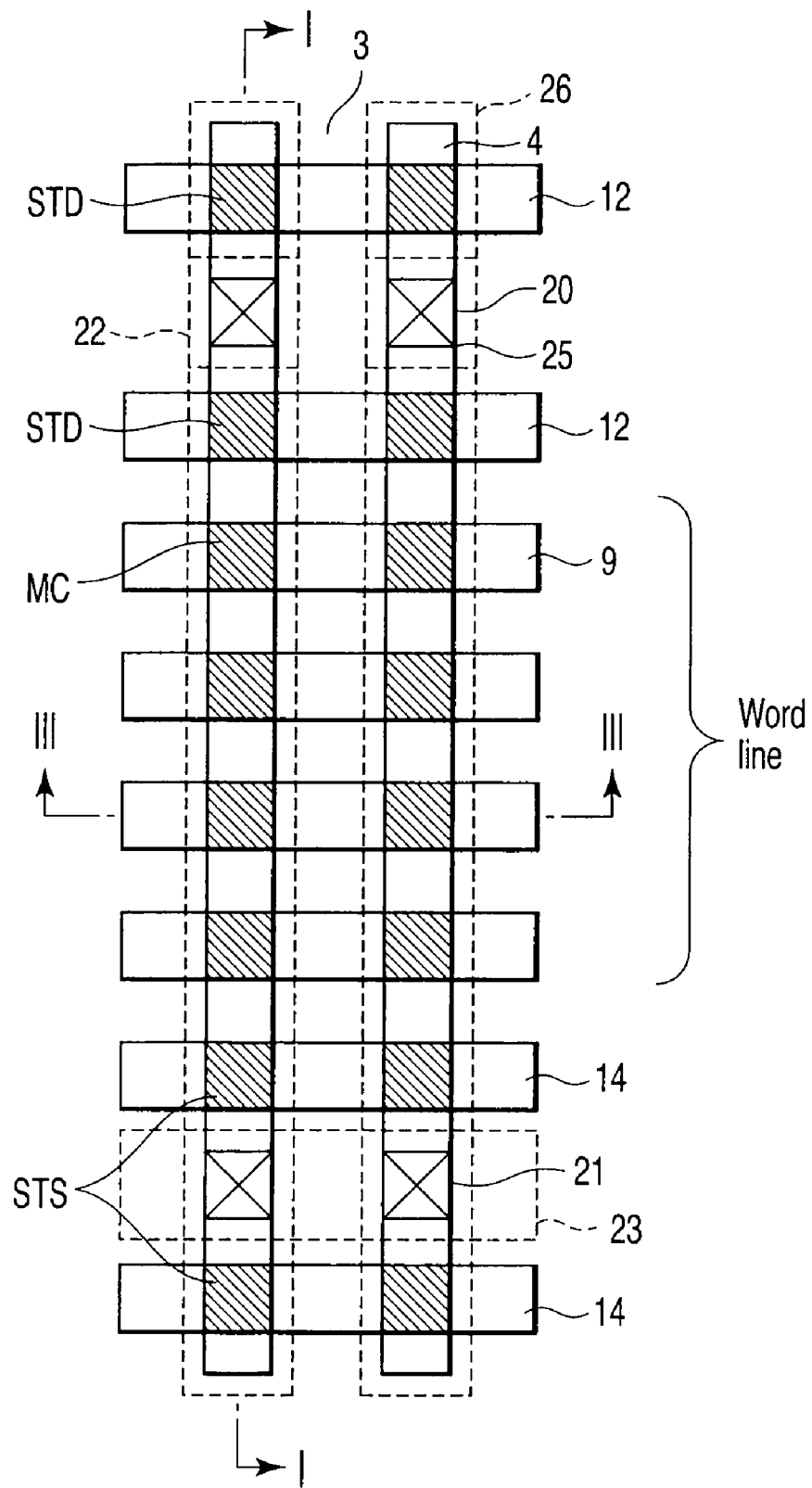
FIG. 2 is a plan view showing the NAND-type nonvolatile semiconductor memory device according to the first embodiment.
Figure 3:
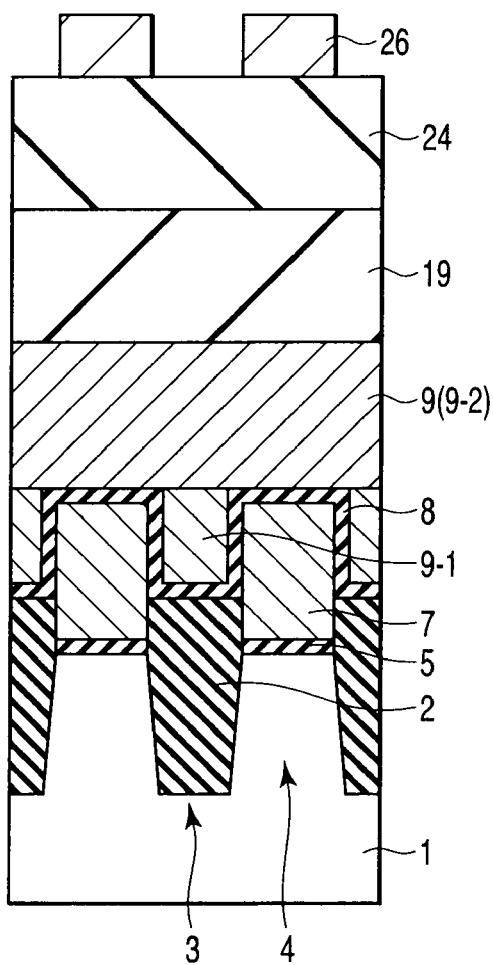
FIG. 3 is a cross-sectional view taken along line III-III in FIG. 2.

FIG. 1 to FIG. 3 show a NAND-type nonvolatile semiconductor memory device according to a first embodiment of the invention. FIG. 2 is a plan view of the NAND-type nonvolatile semiconductor memory device. In FIG. 2, a plurality of element regions 4 are separated by element isolation regions 3. NAND cell units are formed on the respective element regions 4. Each NAND cell unit is composed of, for example, four memory cells MC, which are connected in series to constitute a NAND cell, a drain-side selection transistor STD, and a source-side selection transistor STS. The number of memory cells, which constitute the NAND cell, is not limited to four, and may be set at an arbitrary number such as 16 or 32. A plurality of memory cells MC, which are arranged in a row direction (i.e., the right-and-left direction in FIG. 2) are connected by a common control gate line (word line) 9. The drain-side selection transistors STD are connected to a common drain-side selection gate line 12, and the source-side selection transistors STS are connected to a common source-side selection gate line 14. The drain-side selection transistor STD is connected via a bit line contact 20 to a bit line connection portion 22 which is formed of a first wiring layer, and is further connected via an interwire contact 25 to a bit line 26. The source-side selection transistor STS is connected via a source line contact 21 to a source line 23 which is formed of the first wiring layer.

The four memory cells MC, drain-side selection transistor STD and source-side selection transistor STS constitute one memory cell array. One memory cell array adjoins another memory cell array (not shown) in a column direction (bit line direction in FIG. 2), with the bit line contact 20 being positioned at the center between the adjoining memory cell arrays. Further, one memory cell array adjoins another memory cell array (not shown) in a column direction, with the source line contact 21 being positioned at the center between the adjoining memory cell arrays.

FIG. 1 is a cross-sectional view taken along line I-I in FIG. 2, and FIG. 3 is a cross-sectional view taken along line III-III in FIG. 2.

In FIG. 1 and FIG. 3, a well is formed in a semiconductor substrate (silicon substrate) 1. The element regions 4, which are isolated by the element isolation regions 3, are formed in the well. A gate insulation film 5 is formed on the element region 4. A plurality of memory cell gate electrodes 6 of the memory cells MC, a gate electrode 12 of the drain-side selection transistor STD and a gate electrode 14 of the source-side selection transistor STS are formed on the gate insulation film 5. The drain-side selection transistor STD and source-side selection transistor STS may be formed on gate insulation films which are different from tunnel insulation films of the memory cells MC.

Each of the memory cell gate electrodes 6 includes a floating gate electrode 7 which functions as a charge storage layer, an inter-gate insulation film 8 which is formed on the floating gate electrode 7, and a control gate electrode 9 which is formed on the inter-gate insulation film 8. Those parts of the control gate electrode 9 and the gate electrodes 12 and 14 of the drain-side and source-side selection transistors STD and STS, which are located above the inter-gate insulation films 8, are entirely formed of silicide layers 9-2. The silicide layer 9-2 can be formed, for example, by making use of cobalt silicide. As shown in FIG. 3, the control gate 9 is shared by a control gate of another memory cell MC which is disposed in the row direction, thereby forming a word line. That part of the floating gate electrode 7, which is in contact with the gate insulation film 5, is not silicided and is a silicon layer (polysilicon layer 7a).

Diffusion layers 11, which are formed in the element region 4, constitute source/drain regions of each memory cell MC and source/drain regions of the drain-side selection transistor STD and source-side selection transistor STS. Each memory cell MC, drain-side selection transistor STD and source-side selection transistor STS are connected in series via the diffusion layers 11.

A diffusion layer 13 for bit line contact is formed in a part of the element region 4, which is located on that side of the gate electrode 12 of the drain-side selection transistor STD, which is opposite to the memory cell MC. In addition, a diffusion layer 15 for source line contact is formed in a part of the element region 4, which is located on that side of the gate electrode 14 of the source-side selection transistor STS, which is opposite to the memory cell MC.

A part of the inter-gate insulation film of each of the gate electrode 12 of the drain-side selection transistor STD and the gate electrode 14 of the source-side selection transistor STS is removed, and the floating gate electrode 7 and the control gate electrode 9 are electrically connected. That part of the gate electrode 12, 14, which is in contact with the gate insulation film 5, is not silicided, as in the case of the control gate electrode 9, and is a silicon layer.

The memory cell MC is composed of the gate electrode 6 and diffusion layers 11. The drain-side selection transistor STD is composed of the gate electrode 12, diffusion layer 11 and diffusion layer 13 for bit line contact. The source-side selection transistor STS is composed of the gate electrode 14, diffusion layer 11 and diffusion layer 15 for source line contact.

As described above, the memory cells MC are connected in series without a contact. The drain-side selection transistor STD and source-side selection transistor STS are connected to both ends of the series-connected memory cells MC via the diffusion layers 11.

First insulation films 16, which are formed of, e.g., silicon oxide films, are formed between the gate electrodes 6 of the memory cells MC, the gate electrode 12 of the drain-side selection transistor STD and the gate electrode 14 of the source-side selection transistor STS. First insulation films 16 are formed on that side surface of the gate electrode 12 of the drain-side selection transistor STD, which is opposite to the memory cell MC, and on that side surface of the gate electrode 14 of the source-side selection transistor STS, which is opposite to the memory cell MC. Above the diffusion layer 13, 15, a second insulation film 17 is formed on the first insulation film 16. The second insulation film 17 can be formed by making use of a film with an etching rate different from the etching rate of the first insulation film 16, for example, a silicon nitride film.

A third insulation film 18 is formed on the second insulation film 17. The third insulation film 18 is formed of, e.g., boron phosphorous silicate glass (BPSG)(a silicon oxide film containing boron).

An interlayer insulation film 19 is provided on the first insulation films 16, third insulation films 18 and control gate electrodes 9. The interlayer insulation film 19 is formed of, e.g., a tetraethyl orthosilicate (TEOS) film.

A bit line contact electrode 20 and a source line contact electrode 21 are formed so as to penetrate the interlayer insulation film 19, third insulation films 18, second insulation films 17 and gate insulation film 5. The bit line contact electrode 20 is connected to the diffusion layer 13 for bit line contact, and the source line contact electrode 21 is connected to the diffusion layer 15 for source line contact.

A bit line connection portion 22 is formed of a first wiring layer on the bit line contact electrode 20, and a source line 23 is formed of the first wiring layer on the source line contact electrode 21. The bit line connection portion 22 and source line 23 are covered with an interwire insulation layer 24. An interwire contact 25, which is connected to the bit line connection portion 22, is formed in the interwire insulation film 24. A bit line 26, which is connected to the interwire contact 25, is formed of a second wiring layer on the interwire insulation film 24.

In the above-described structure, it is assumed that the well is of a P-type and the source/drain diffusion layers are of an N-type. Alternatively, the well may be of an N-type and the source/drain diffusion layers may be of a P-type.

As shown in FIG. 3, the device isolation region 3 is formed of a device isolation insulation film 2. The floating gate electrode 7 is formed on the element region 4 that is isolated by the device isolation region 3. The inter-gate insulation film 8 is formed on the upper and side surfaces of the floating gate electrode 7, and the control gate electrode 9 is formed on the inter-gate insulation film 8. The control gate electrode 9 is formed of the silicide layer 9-2 down to a level of the interface with the inter-gate insulation film 8 that is formed on the upper surface of the floating gate electrode 9. That part of the control gate electrode 9, which is located between the floating gate electrodes 7, is not silicided and is a silicon layer 9-1.

The interlayer insulation film 19 is formed on the control gate electrode 9, and the interwire insulation film 24 is formed on the interlayer insulation film 19. The bit line 26 is provided on the interwire insulation film 24.

Shallow trench isolation (STI) is used as a method for the device isolation. Alternatively, another device isolation method, such as local oxidation of silicon (LOCOS), may be used.

In the first embodiment, the inter-gate insulation film 8 includes a part which is in contact with the silicide layer 9-2 of the control gate electrode 9. However, if an upper surface of the inter-gate insulation 8, that is, the part in contact with the control gate electrode 9, is formed of a silicon nitride film, a decrease in breakdown voltage of the inter-gate insulation film 8 can be prevented.

Next, referring to FIG. 4 to FIG. 15, a description is given of a method of manufacturing the nonvolatile semiconductor memory device according to the present embodiment.

Figure 4:
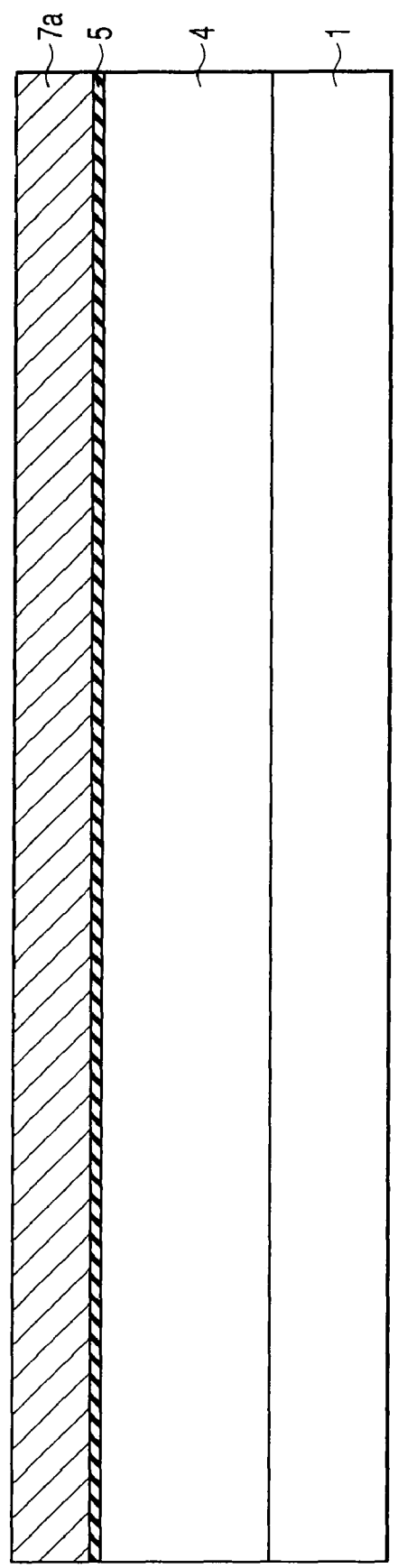
FIG. 4 is a cross-sectional view illustrating a manufacturing step of the NAND-type nonvolatile semiconductor memory device according to the first embodiment.

To start with, as shown in FIG. 4, a well (not shown) and a channel region (not shown) are formed in a semiconductor substrate 1 such as a silicon substrate. Then, a gate insulation film 5 is formed of, e.g., a silicon oxide film on the semiconductor substrate 1. On the gate insulation film 5, a polysilicon layer 7a, which becomes a floating gate electrode 7, is deposited.

Figure 5:
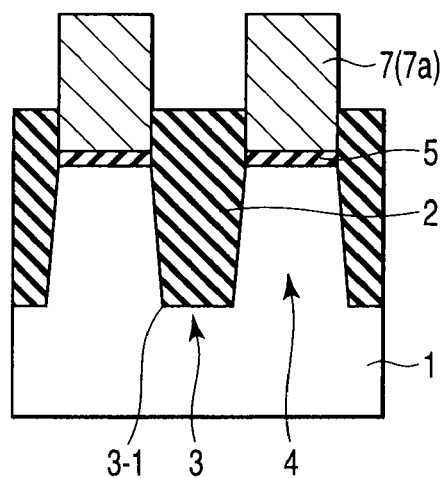
FIG. 5 is a cross-sectional view illustrating a manufacturing step following the manufacturing step in FIG. 4.

Subsequently, as shown in FIG. 5, the polysilicon layer 7a, gate insulation film 5 and silicon substrate 1 are successively etched by lithography, and a trench 3-1 is formed in the silicon substrate 1. The trench 3-1 is filled with an element isolation insulation film 2, which is formed of, e.g., a silicon oxide film. The element isolation insulation film 2 is then etched back to a proper level. Thereby, the element isolation region 3 and the element region 4, which is isolated by the element isolation region 3, are formed.

Figure 6:
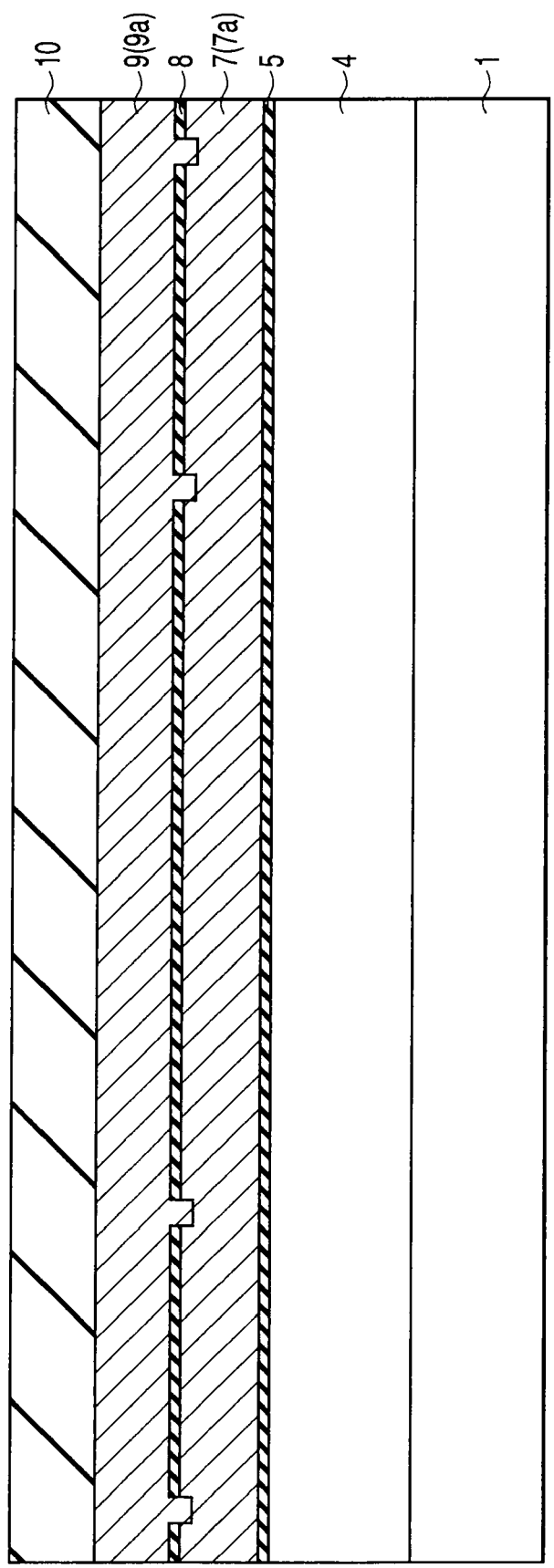
FIG. 6 is a cross-sectional view illustrating a manufacturing step following the manufacturing step in FIG. 4.
Figure 7:
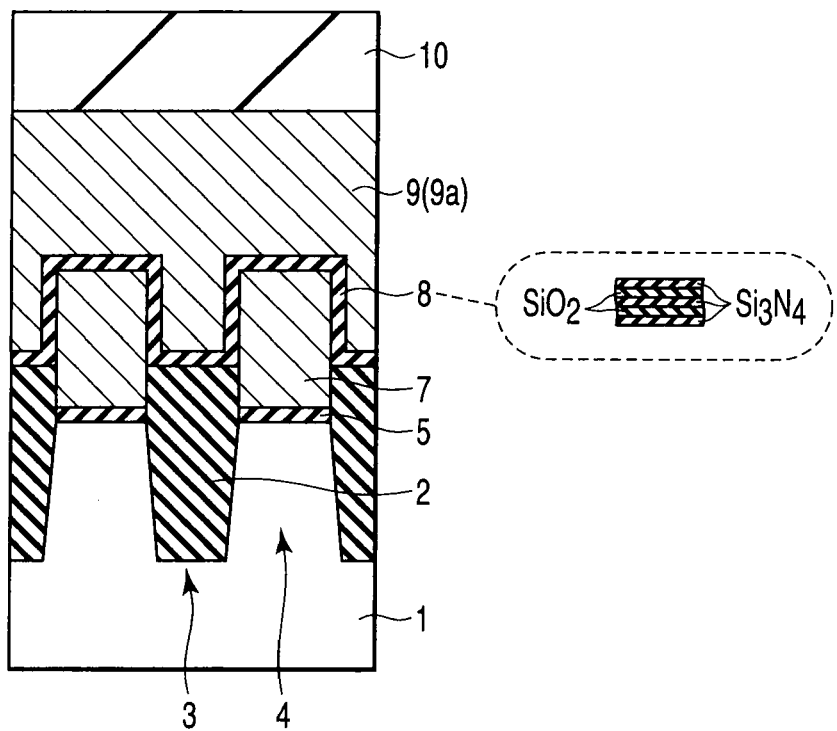
FIG. 7 is a cross-sectional view illustrating a manufacturing step following the manufacturing step in FIG. 5.

Next, as shown in FIG. 6 and FIG. 7, an inter-gate insulation film 8, which is formed of a stacked structure of, e.g., a silicon nitride film/silicon oxide film/silicon nitride film/silicon oxide film/silicon nitride film, a polysilicon layer 9a that becomes a control gate electrode 9, and a gate mask material 10 of a silicon nitride film are successively formed on the floating gate electrode 7 and element isolation region 3. At this time, parts of the inter-gate insulation film 8 are removed in regions which become gate electrodes of the drain-side and source-side selection transistors STD and STS, and the floating gate electrode 7 and the control gate electrode 9 are electrically connected.

Figure 9:
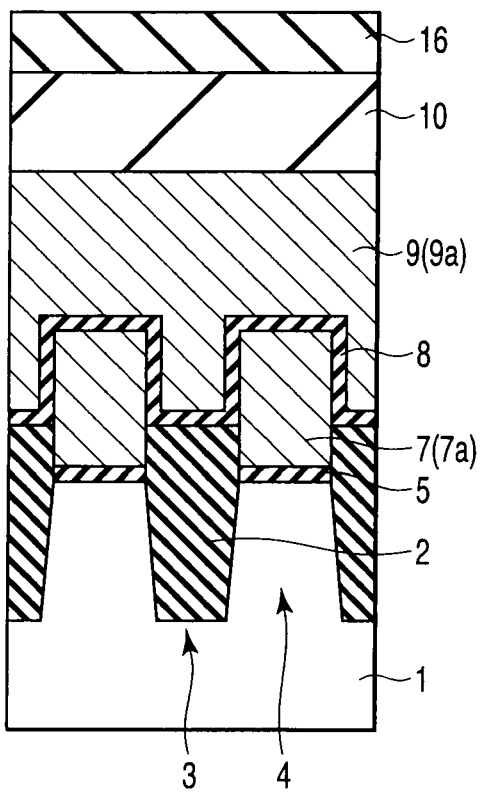
FIG. 9 is a cross-sectional view illustrating a manufacturing step following the manufacturing step in FIG. 7.

Next, as shown in FIG. 8 and FIG. 9, the gate mask material 10 is etched by photolithography, and a mask pattern for etching the gate electrodes of the memory cells and the gate electrodes of the drain-side and source-side selection transistors STD and STS is formed. Using the mask pattern of the gate mask material 10, the polysilicon layer 9a, inter-gate insulation film 8 and polysilicon layer 7a are etched, and the gate electrodes 6 of the memory cells, the gate electrode 12 of the drain-side selection transistor STD and the gate electrode 14 of the source-side selection transistor STS are formed. Thereafter, post-oxidation for recovering damage at the time of gate processing is performed, following which impurity ions are implanted in the semiconductor substrate 1, thus forming diffusion layers 11, 13 and 15. This ion implantation step may be performed prior to the post-oxidation.

Next, on the structure thus formed, a first insulation film 16 is formed of, e.g., a silicon oxide film. The thickness of the first insulation film 16 is set such that the regions between the gate electrodes 6 of the memory cells are completely buried and the region between the gate electrodes 12 of the drain-side selection transistors STD and the region between the gate electrodes 14 of the source-side selection transistors STS are not completely buried. The first insulation film 16 may be formed by depositing silicon oxide films with different film qualities by two or more deposition steps.

Figure 10:
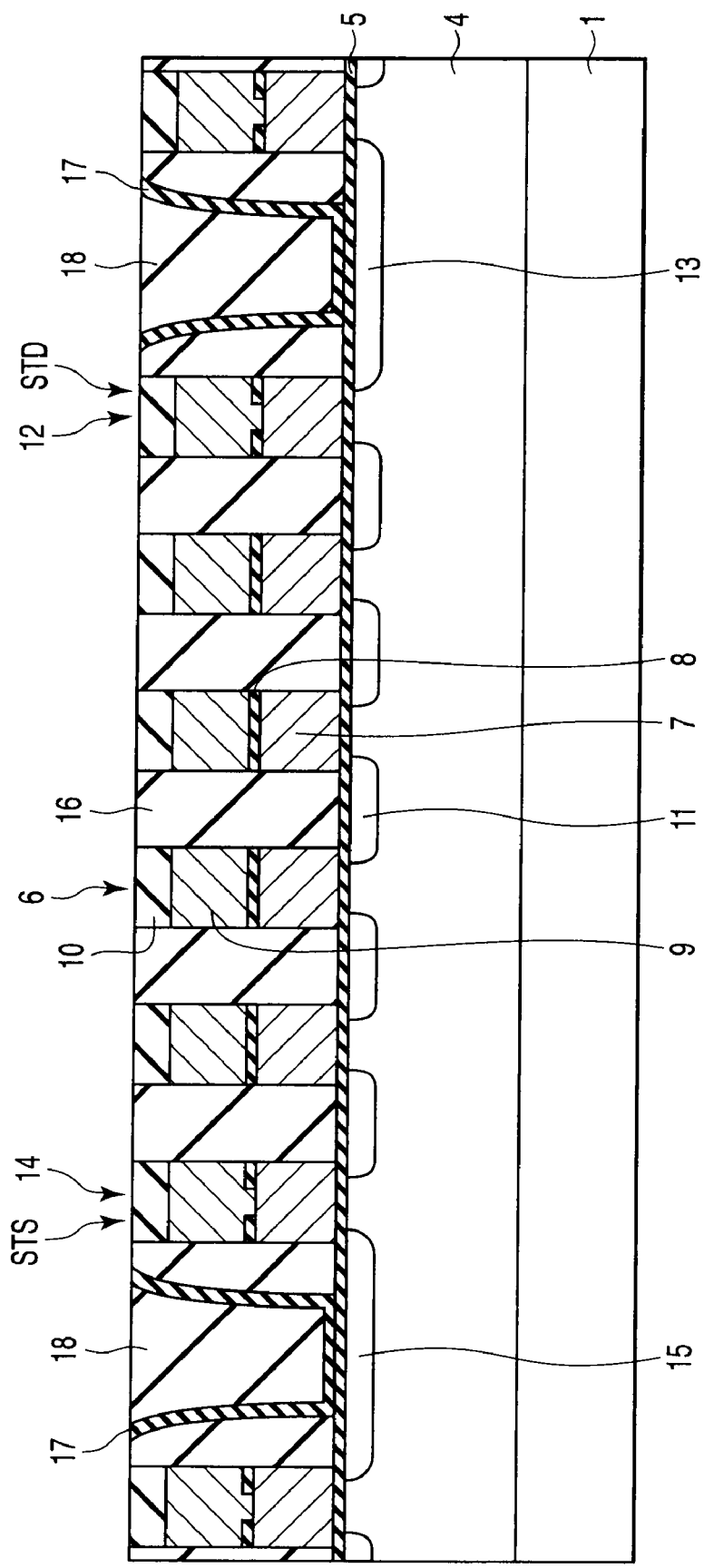
FIG. 10 is a cross-sectional view illustrating a manufacturing step following the manufacturing step in FIG. 8.

Following the above, the first insulation film 16 is etched back, as shown in FIG. 10 and FIG. 11. As a result, the first insulation films 16 are left between the gate electrodes 6 of the memory cells, and side walls are formed of the first insulation film 16 between the gate electrodes 12 of the drain-side selection transistors STD and between the gate electrodes 14 of the source-side selection transistors STS. Subsequently, second insulation films 17 are formed of, e.g., silicon nitride films on the exposed parts. Further, third insulation films 18 of, e.g., BPSG are deposited on the second insulation films 17, and the third insulation films 18 are buried between the gate electrodes 12 of the drain-side selection transistors STD and between the gate electrodes 14 of the source-side selection transistors STS. Thereafter, using the gate mask material 10 as a stopper, the third insulation films 18 are planarized by chemical mechanical polishing (CMP).

Figure 12:
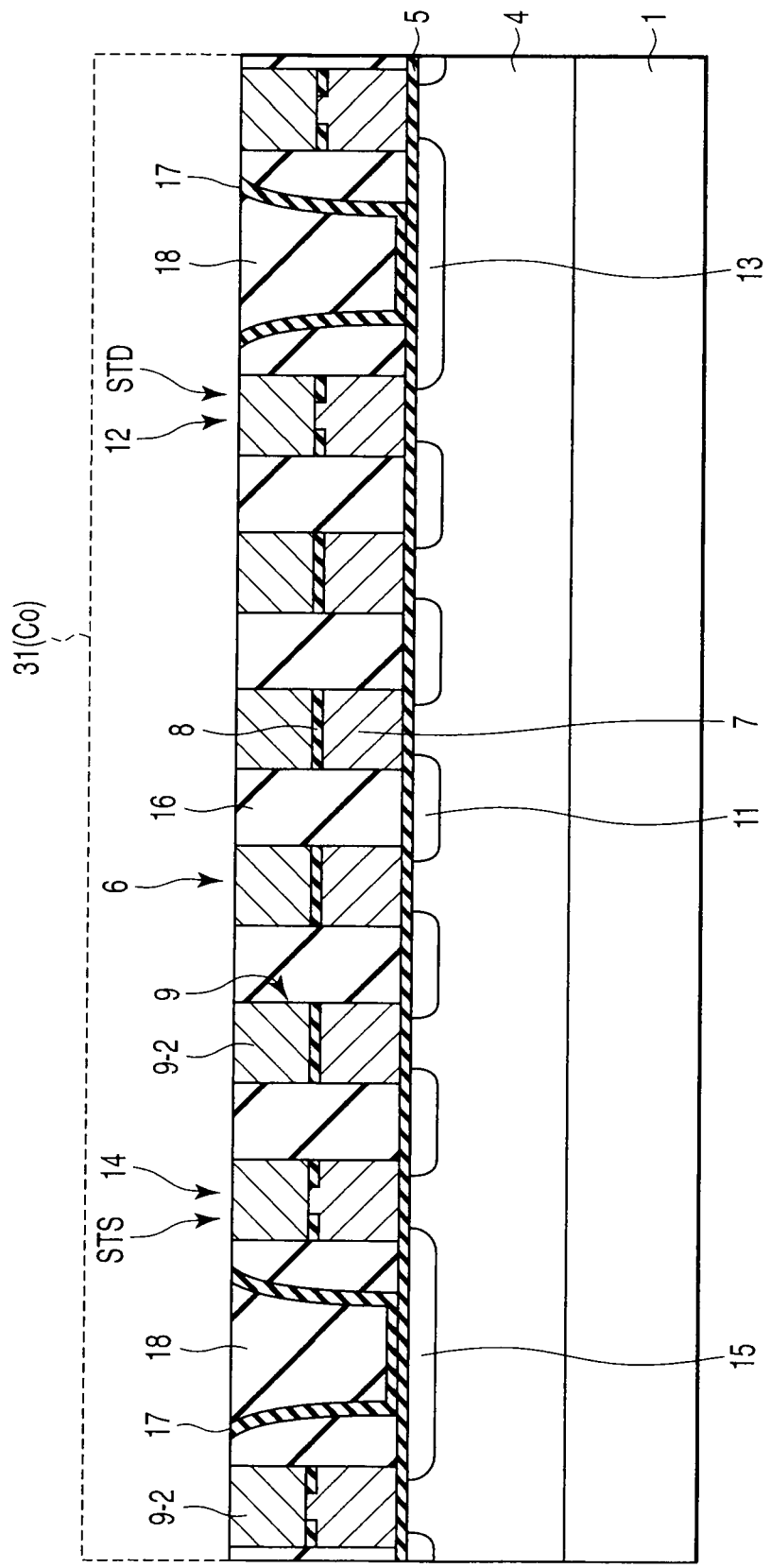
FIG. 12 is a cross-sectional view illustrating a manufacturing step following the manufacturing step in FIG. 10.

Thereafter, as shown in FIG. 12 and FIG. 13, the silicon nitride film, which is exposed to the surface of the structure, is etched, and the gate mask material 10 is removed. At this time, the first insulation films 16 are also etched, and the entire structure is planarized. Then, a natural oxidation film, etc. on the substrate surface are eliminated by, e.g., diluted hydrofluoric acid. Subsequently, a cobalt film 31 is deposited on the entire surface by, e.g., sputtering, as shown by a broken line in FIGS. 12 and 13. By heat treatment, the polysilicon of the control gate electrode 9 reacts with the cobalt, and cobalt silicide layers 9-2 are formed.

As a result, as shown in FIG. 13, the control gate electrode 9 has a stacked structure of the polysilicon layer 9-1 and cobalt silicide layer 9-2. By optimizing the heat treatment step for siliciding, the control gate electrode 9 is formed such that the silicide layer 9-2 is formed down to the level of the interface with the inter-gate insulation film 8 and that part of the control gate electrode 9, which is located between the floating gate electrodes 7, is not silicided and remains the silicon layer.

The process of siliciding cobalt is, for example, as follows. To begin with, the deposited cobalt is subjected to first heat treatment, and a reaction takes place between cobalt and silicon. Thereby, a monosilicide (CoSi) is formed. The conditions for the heat treatment at this time are, for example, the temperature of 400° C. to 600° C., preferably 500° C. or above, and the process time of about 30 seconds. Then, using a mixture solution (sulfuric peroxide mixture) of hydrochloric acid or sulfuric acid and hydrogen peroxide solution, the non-reacted cobalt film is removed. Subsequently, second heat treatment is performed, and the monosilicide is changed to a disilicide (CoSi2). The conditions for the heat treatment at this time are, for example, the temperature of 650° C. or above, preferably 750° C. or above, and the process time of about 30 seconds.

As described above, in the memory cell MC, the control gate electrode 9 is silicided down to the level of the interface with the inter-gate insulation film 8. Thus, the gate electrode 12, 14 of the source-side/drain-side selection side transistor STS, STD is silicided down to the level of the interface with the inter-gate insulation film 8, and the part thereof which contacts the gate insulation film 5 is not silicided and remains the silicon layer.

Figure 14:
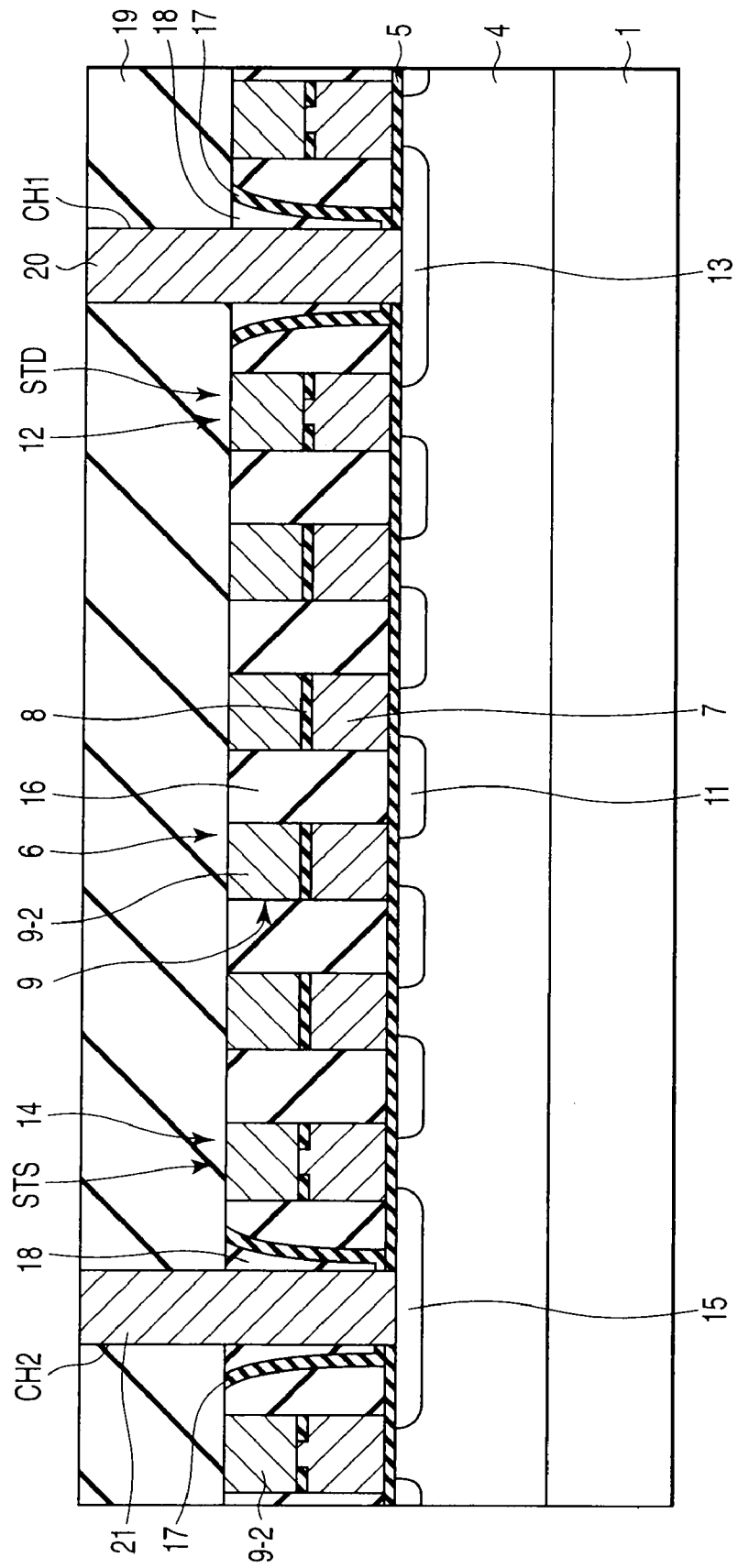
FIG. 14 is a cross-sectional view illustrating a manufacturing step following the manufacturing step in FIG. 12.

Next, as shown in FIG. 14 and FIG. 15, an interlayer insulation film 19 is deposited on the entire surface of the structure, and contact holes CH1 and CH2 for contact with the diffusion layer 13 for bit line contact and the diffusion layer 15 for source line contact are formed in the interlayer insulation film 19. The contact holes CH1 and CH2 are formed by successively etching the interlayer insulation film 19 and third insulation film 18, and then successively etching the second insulation film 17 and gate insulation film 5. Thereby, the diffusion layer 13 for bit line contact and the diffusion layer 15 for source line contact are exposed by the contact holes CH1 and CH2.

Subsequently, as shown in FIG. 14, the contact holes CH1 and CH2 are filled with metal such as aluminum or tungsten, or low-resistance semiconductor material, and a bit line contact electrode 20 and a source line contact electrode 21 are formed.

Thereafter, as shown in FIG. 1 and FIG. 3, a bit line connection part 22, which is connected to the bit line contact electrode 20, and a source line 23, which is connected to the source line contact electrode 21, are formed of a metal wiring layer on the interlayer insulation film 19. Further, an interwire insulation film 24 is deposited on the entire surface of the structure, and an interwire contact 25 is formed in the interwire insulation film 24. A bit line 26, which is connected to the interwire contact 25, is formed on the interwire insulation film 24.

Following the above-described step, an upper wiring layer is formed by a generally known method, and the nonvolatile semiconductor memory device is completed.

According to the first embodiment, the control gate electrode 9 is formed of the silicide layer 9-2, down to the level of the interface with the inter-gate insulation film 8 that is formed on the floating gate electrode 7. Therefore, the resistance of the control gate electrode 9 can be decreased, and the operation speed of the memory cell can be increased.

Moreover, the entirety of the control gate electrode 9 above the level of the inter-gate insulation film 8 is formed of the silicide layer 9-2, and no depletion layer is formed unlike the case where the silicon layer is formed. Therefore, a decrease in capacitance of the inter-gate insulation film 8 can be prevented, the coupling ratio can be increased and the characteristics of the memory cell can be enhanced.

Besides, that part of the control gate electrode 9, which is located between the floating gate electrodes 7 is not silicided and is the silicon layer 9-1. It is thus possible to prevent the breakdown voltage of the inter-gate insulation film 8 from decreasing due to stress occurring when the narrow region between the floating gate electrodes 7 is silicided.

The gate electrode of each of the drain-side selection transistor STD and source-side selection transistor STS is also silicided down to the level of the inter-gate insulation film 8. Thus, the resistance of the gate electrode can be decreased, and the operation speed of the selection transistors can be increased.

That part of the gate electrode of each of the drain-side selection transistor STD and source-side selection transistor STS, which is in contact with the gate insulation film 5, is not silicided and remains the silicon layer. Thus, in the drain-side selection transistor STD and source-side selection transistor STS, a decrease in breakdown voltage of the gate insulation film 5 can be prevented.

In the first embodiment, the siliciding of the gate electrode is controlled by optimizing the process conditions. However, the method of controlling the siliciding is not limited to this example. An insulation film, which serves as a stopper for siliciding, may be formed at a specific position.

FIG. 16A and FIG. 16B show examples of the technique of controlling siliciding in the gate electrodes 12 and 14 of the drain-side and source-side selection transistors STD and STS. In order to control siliciding, it is effective to form an insulation film at a position where the siliciding is to be stopped. Normally, in the selection gate electrode 12, 14, it is necessary to electrically connect the polysilicon layer 7a for the floating gate electrode 7 and the polysilicon layer 9a for the control gate electrode 9. Thus, the provision of the insulation film between the polysilicon layer 7a and the polysilicon layer 9a, which increases the resistance value, is not preferable, but the insulation film is effective in controlling the siliciding.

In FIGS. 16A and 16B, when an opening for connecting the polysilicon layer 7a for the floating gate electrode 7 and the polysilicon layer 9a for the control gate electrode 9 is formed in the inter-gate insulation film 8, an insulation film 41 is formed on the exposed surface of the polysilicon layer 7a. The insulation film 41 should preferably be a silicon oxide film or a silicon nitride film, but it may be a natural oxide film. In FIG. 16A and FIG. 16B, the shape of the insulation film 41 differs due to the difference in the control of etching at the time of forming the opening in the inter-gate insulation film 8.

As has been described above, by forming the insulation film 41 between the polysilicon layer 7a for the floating gate electrode 7 and the polysilicon layer 9a for the control gate electrode 9, the siliciding of the polysilicon layer 9a can surely be controlled in the selection gate 12, 14.

(Second Embodiment)

Figure 17:
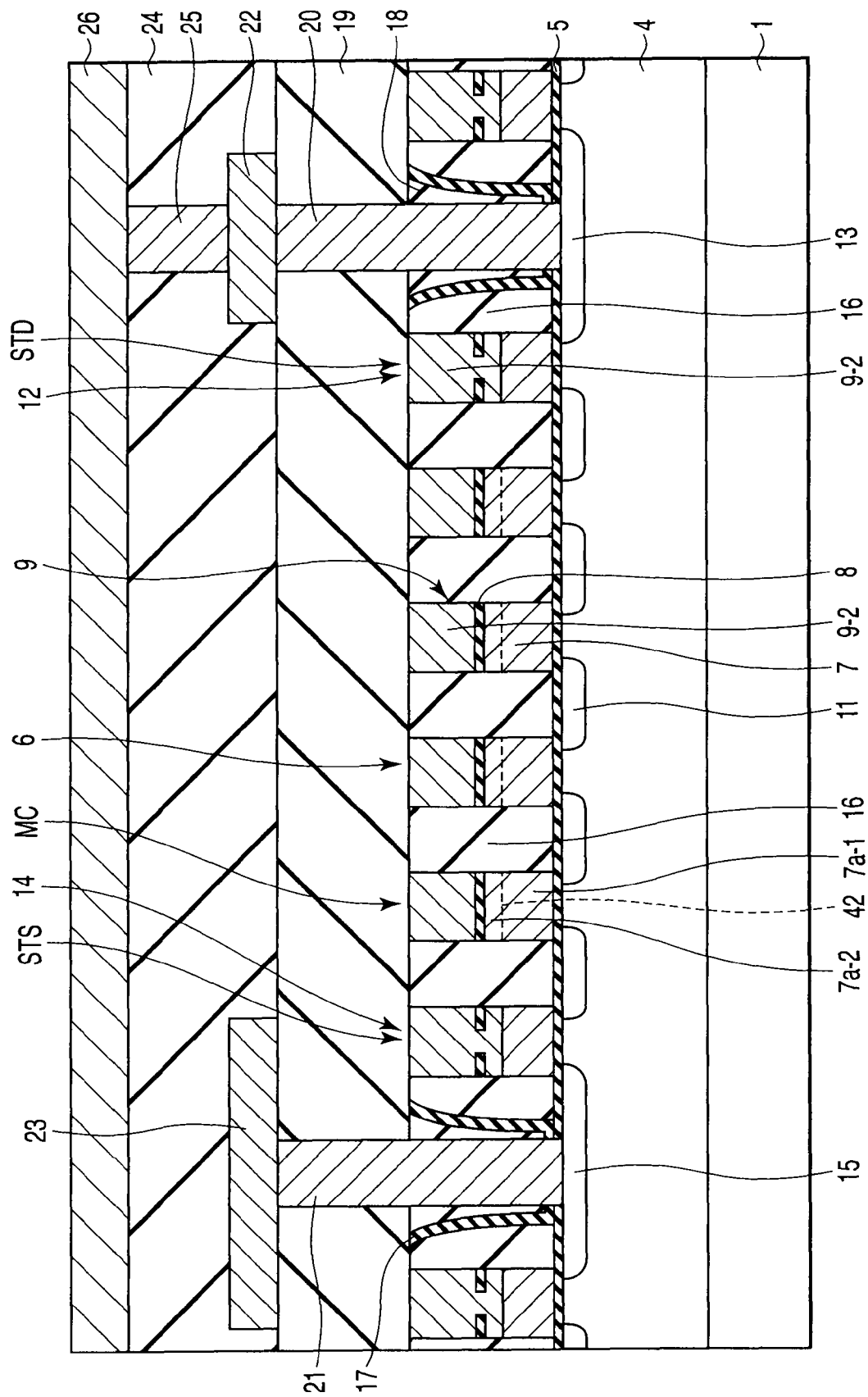
FIG. 17 is a cross-sectional view showing a second embodiment of the invention.
Figure 18:
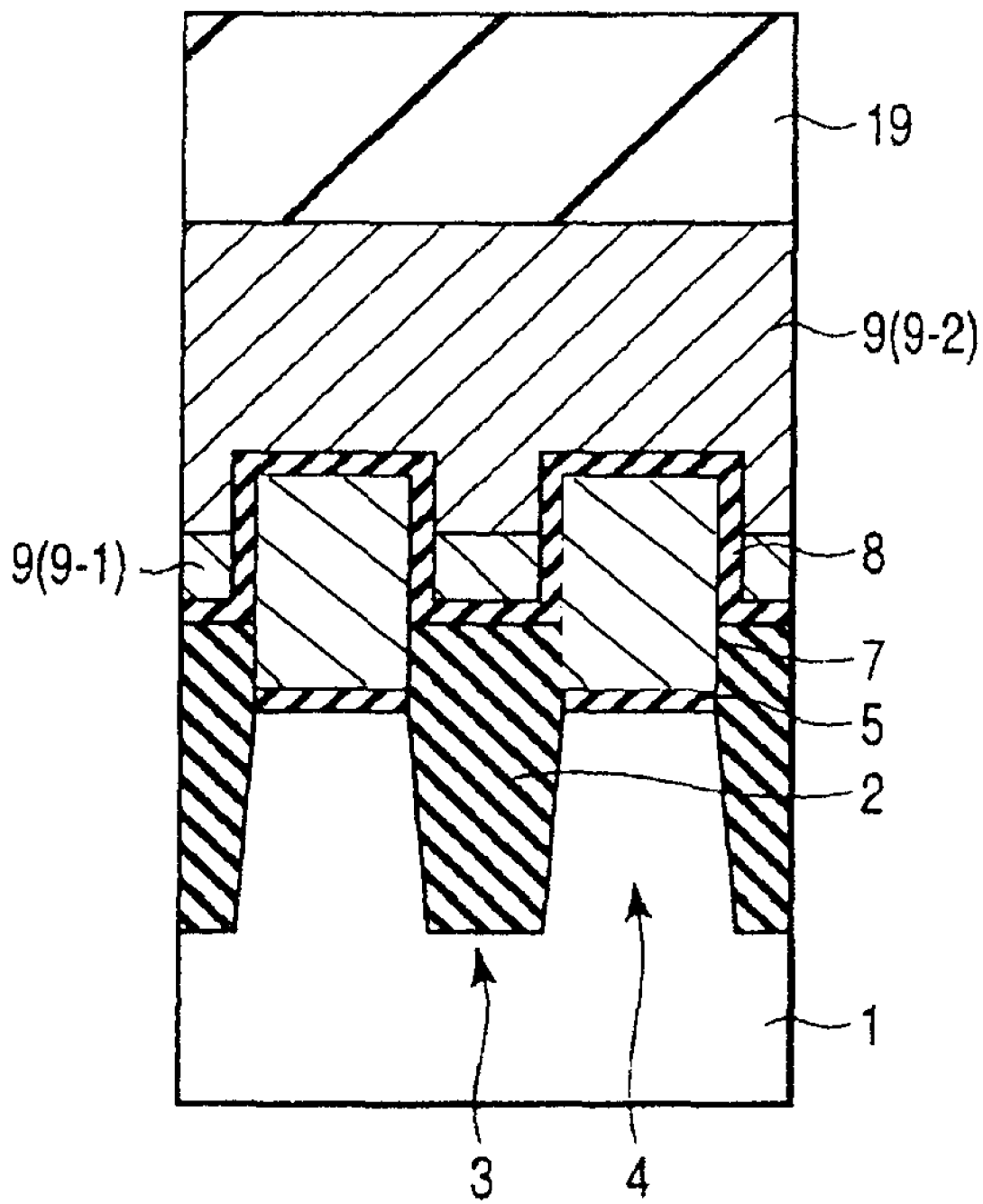
FIG. 18 is a cross-sectional view showing the second embodiment.

FIG. 17 and FIG. 18 show a second embodiment of the invention. In the second embodiment, the parts common to those in the first embodiment are denoted by like reference numerals.

In the first embodiment, the control gate electrode 9 is silicided down to the level of the interface with the inter-gate insulation film 8 that is formed on the upper surface of the floating gate electrode 7, and the part thereof between the floating gate electrodes 7 is not silicided and remains the silicon layer.

By contrast, in the second embodiment, as shown in FIG. 18, a portion of that part of the control gate electrode 9, which is located between the floating gate electrodes 7, is also formed of a silicide layer 9-2. The other portion of the part of the control gate electrode 9 between the floating gate electrodes 7 is formed of a silicon layer 9-1.

Further, as shown in FIG. 17, each of the gate electrodes 12 and 14 of the drain-side and source-side selection transistors STD and STS is silicided to the same level as the silicide layer 9-2 of the memory cell. However, that part of the gate electrode 12, 14, which contacts the gate insulation film 5, is not silicided and is the silicon layer (polysilicon 7a). Thus, in the drain-side and source-side selection transistors STD and STS, a decrease in breakdown voltage of the gate insulation film 5 can be prevented.

In the second embodiment, the control of siliciding can be realized by optimizing the heat treatment step. In order to more surely control the siliciding, for example, the polysilicon layer 7a for the floating gate electrode 7 is formed to have a double-layer structure comprising polysilicon layers 7a-1 and 7a-2, as shown in FIG. 17, and a thin insulation film 42 is formed between the polysilicon layers 7a-1 and 7a-2. The same insulation film as the insulation film 41 described in the first embodiment is applicable to the insulation film 42. With this structure, the siliciding can surely be stopped by the insulation film 42.

According to the second embodiment, the entirety of that part of the control gate electrode 9, which is located above the level of the inter-gate insulation film 8 on the floating gate electrode 7, is silicided. Thus, the resistance of the control gate electrode 9 can be decreased and the operation speed of the memory cell can be increased. Further, since no depletion layer occurs in the control gate electrode 9, the capacitance of the inter-gate insulation film 8 can be increased. Therefore, the coupling ratio can be increased, and the characteristics of the memory cell can be enhanced.

Moreover, a portion of that part of the control gate electrode 9, which is located between the floating gate electrodes 7, is formed of the silicide layer 9-2, and the other portion of the part of the control gate electrode 9 between the floating gate electrodes 7 is formed of the silicon layer 9-1. It is thus possible to prevent the breakdown voltage of the inter-gate insulation film from decreasing due to stress occurring when the narrow region between the floating gate electrodes 7 is silicided. Besides, that part of the gate electrode 12, 14, which contacts the gate insulation film 5, is not silicided and is the silicon layer (polysilicon 7a). Therefore, in the drain-side and source-side selection transistors STD and STS, a decrease in breakdown voltage of the gate insulation film 5 can be prevented.

(Third Embodiment)

Figure 19:
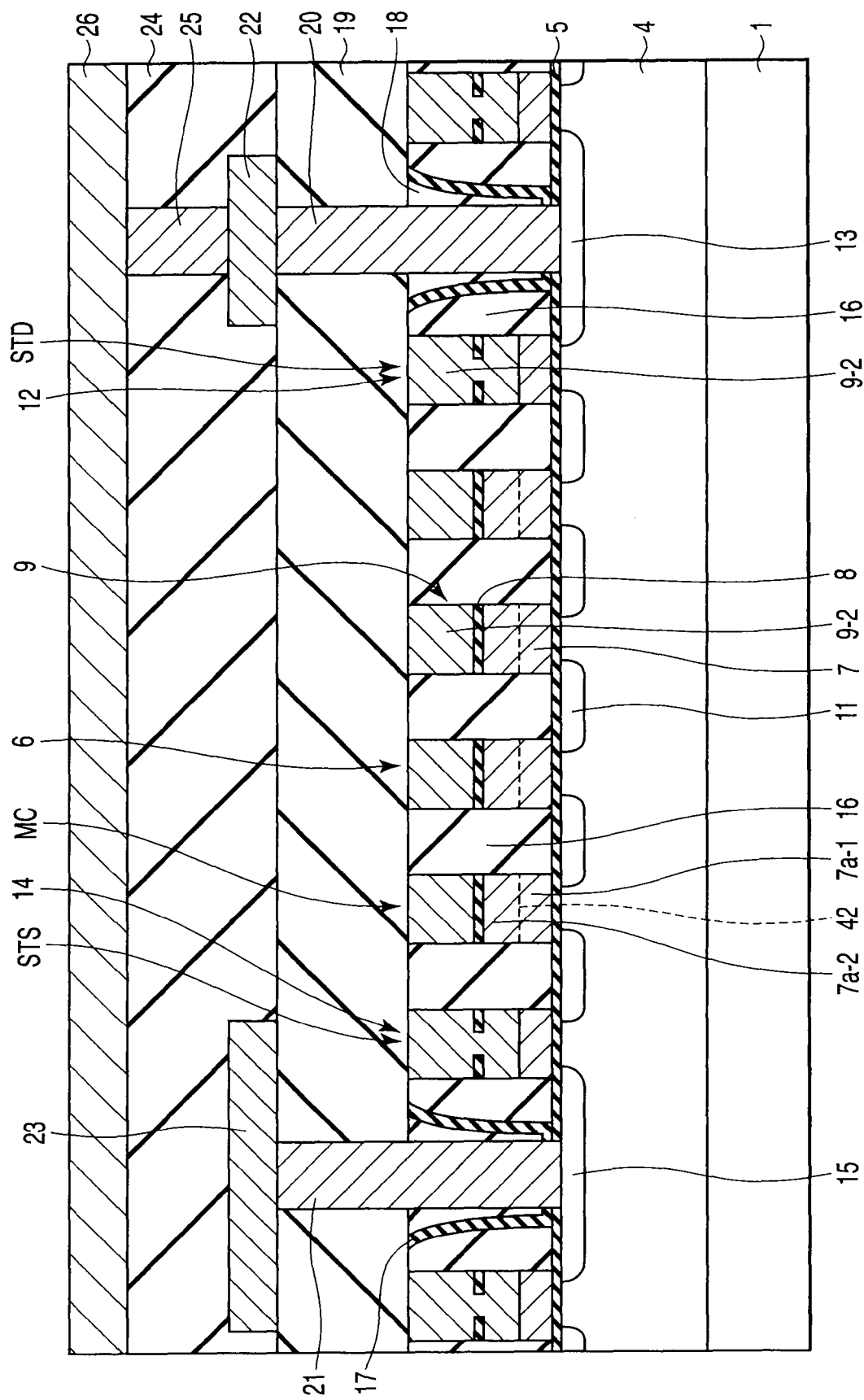
FIG. 19 is a cross-sectional view showing a third embodiment of the invention.
Figure 20:
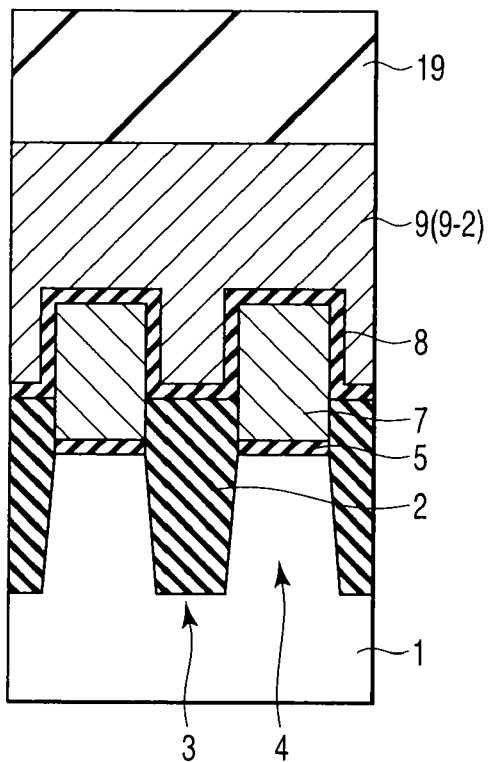
FIG. 20 is a cross-sectional view showing the third embodiment.

FIG. 19 and FIG. 20 show a third embodiment of the invention.

In the second embodiment, the control gate electrode 9 is silicided down to the level of the interface with the inter-gate insulation film 8 that is formed on the upper surface of the floating gate electrode 7. In addition, a portion of that part of the control gate electrode 9, which is located between the floating gate electrodes 7, is silicided, and the other portion of the part of the control gate electrode 9 between the floating gate electrodes 7 is formed of the silicon layer.

By contrast, in the third embodiment, the entirety of that part of the control gate electrode 9, which is located between the floating gate electrodes 7, is silicided. In the other structural aspects, the third embodiment is the same as the first and second embodiments.

In the case where no problem arises with respect to breakdown voltage even if the control gate electrode 9 which is in contact with the inter-gate insulation film 8 is completely silicided, the entire control gate electrode 9 of the memory cell is silicided, as shown in FIG. 19 and FIG. 20. In addition, the upper part of each of the gate electrodes 12 and 14 of the drain-side and source-side selection transistors STD and STS is the silicide layer, and the part thereof which is in contact with the gate insulation film 5 is not silicided and remains the silicon layer (polysilicon layer 7a).

It is thus possible to decrease the resistance of the control gate electrode 9, and to increase the operation speed of the memory cell MC. Moreover, since no depletion layer is formed in the control gate electrode 9, the capacitance of the inter-gate insulation film 8 can be increased. Therefore, the coupling ratio can be increased and the characteristics of the memory cell can be enhanced.

Besides, that part of each of the gate electrodes 12 and 14 of the drain-side and source-side selection transistors STD and STS, which is in contact with the gate insulation film 5, is the silicon layer. Therefore, the resistance of the gate electrode of the selection transistor 12, 14 can be decreased without a decrease in breakdown voltage of the gate insulation film 5, and the operation speed of the selection transistor can be increased.

(Fourth Embodiment)

Figure 21:
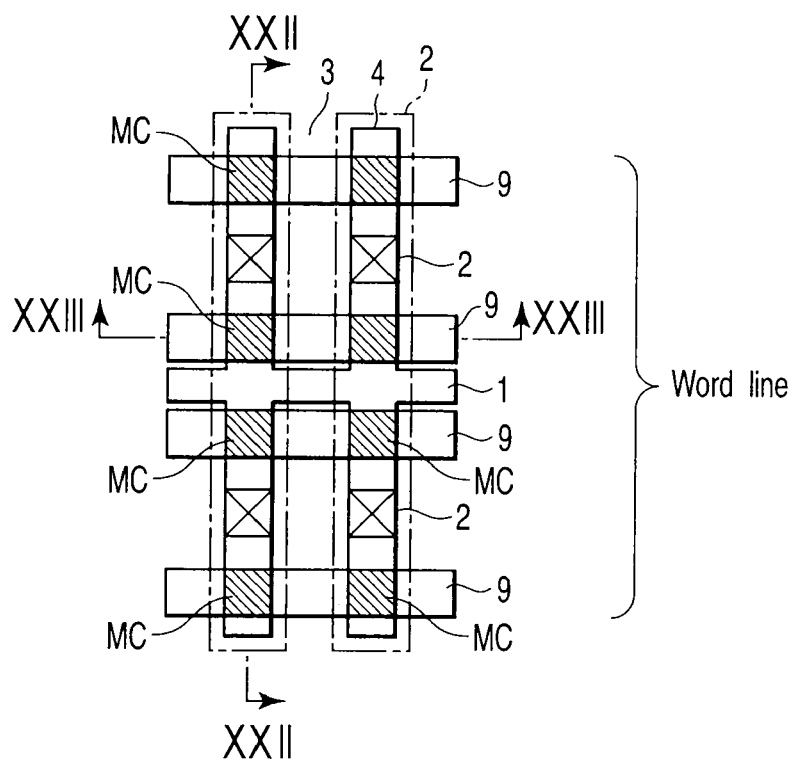
FIG. 21 is a plan view showing a fourth embodiment of the invention, which relates to an example of a NOR-type nonvolatile semiconductor memory device.
Figure 22:
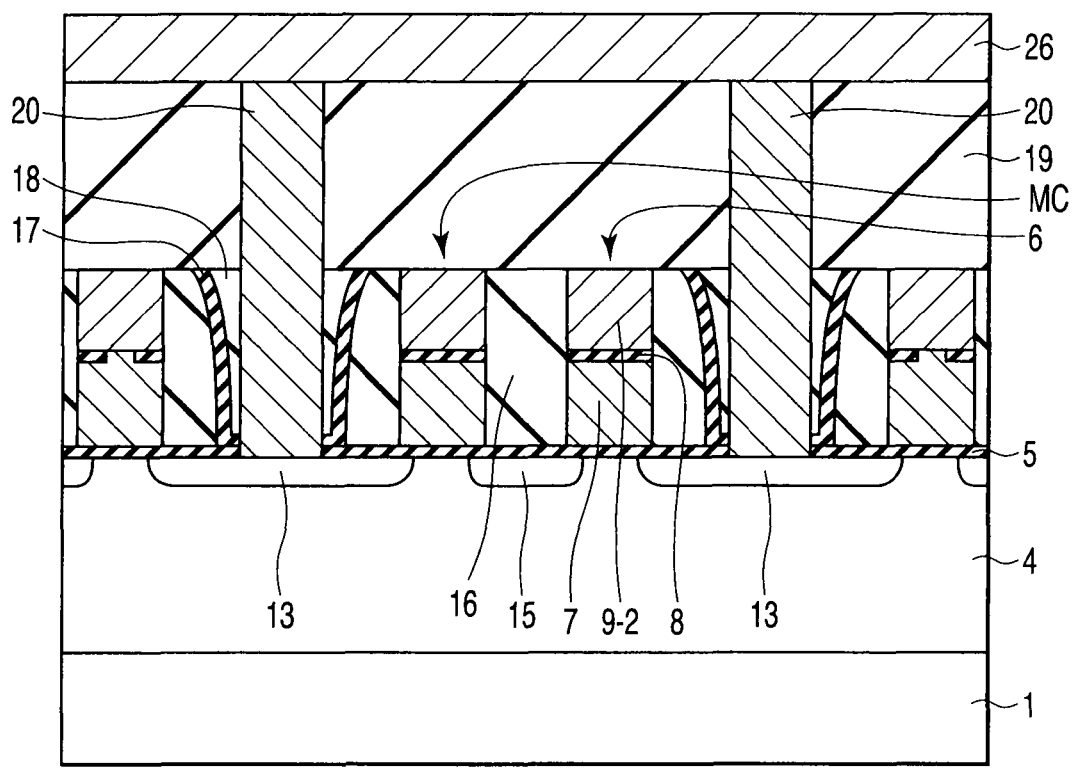
FIG. 22 is a cross-sectional view taken along line XXII-XXII in FIG. 21.
Figure 23:
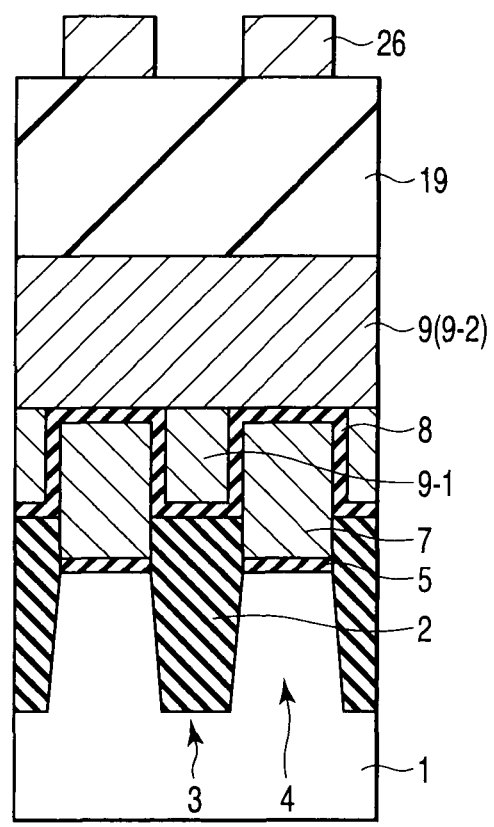
FIG. 23 is a cross-sectional view taken along line XXIII-XXIII in FIG. 21.

FIG. 21, FIG. 22 and FIG. 23 show a fourth embodiment of the invention, which relates to a NOR-type nonvolatile semiconductor memory device.

As is shown in FIG. 21 and FIG. 22, unlike the NAND-type nonvolatile semiconductor memory device, the NOR-type nonvolatile semiconductor memory device is configured to include two series-connected memory cells MC, without including a selection transistor. In the other structural aspects, the fourth embodiment is the same as the first to third embodiments, and the common parts are denoted by like reference numerals.

As is shown in FIG. 22, a gate electrode 6 of the memory cell comprises a floating gate electrode 7 which functions as a charge storage layer, an inter-gate insulation film 8 which is formed on the floating gate electrode 7, and a control gate electrode 9 which is formed on the inter-gate insulation film 8. The control gate electrode 9 is formed of a silicide layer 9-2. The silicide layer 9-2 can be formed, for example, by making use of cobalt silicide. The control gate 9 is shared by other memory cells MC, thereby forming a word line.

Diffusion layers 13 for bit line contact are formed in those portions of the semiconductor substrate 1, which are located on both sides of the two memory cells.

A diffusion layer 15 for a source line is formed between the two memory cells. A first insulation film 16, which is formed of, e.g., a silicon oxide film, is provided on side surfaces of the memory cell gate electrode 6. Above the diffusion layer 13 for bit line contact, a second insulation film 17 is formed on the first insulation film 16. A third insulation film 18 is formed on the second insulation film 17. An interlayer insulation film 19 is provided on the third insulation films 18 and control gate electrodes 9. A bit line contact electrode 20 is formed so as to penetrate the interlayer insulation film 19, third insulation film 18, second insulation film 17 and gate insulation film 5. The bit line contact electrode 20 is connected to the diffusion layer 13 for bit line contact. A bit line 26, which is formed of a first wiring layer, is provided on the bit line contact electrode 20.

As shown in FIG. 23, element isolation regions 3 are provided in a well in an upper part of the semiconductor substrate 1, and the element region 4, which is isolated by the element isolation regions 3, is formed. The floating gate electrode 7 is formed on the element region 4 via the gate insulation film 5. The inter-gate insulation film 8 is formed on the upper surface and side surfaces of the floating gate electrode 7. The control gate electrode 9 is formed on the inter-gate insulation film 8. The control gate electrode 9, which is formed on the floating gate electrode 7, is formed of the silicide layer 9-2 down to the level of the interface with the inter-gate insulation film 8. That part of the control gate electrode 9, which is located between the floating gate electrodes 7, is not silicided and is the silicon layer (polysilicon layer) 9-1. The interlayer insulation film 19 is provided on the control gate electrode 9, and the bit line 26 is provided on the interlayer insulation film 19.

According to the fourth embodiment, the NOR-type nonvolatile semiconductor memory device can have the same advantageous effects as with the first embodiment.

In the fourth embodiment, like the second and third embodiments, a silicide may be formed in a portion of that part of the control gate electrode 9, which is located between the floating gate electrodes 7.

As has been described above, the present invention is applicable not only to the NAND-type nonvolatile semiconductor memory device, but also to the NOR-type nonvolatile semiconductor memory device. The invention is also applicable to AND-type and DiNOR-type nonvolatile semiconductor memory devices. Specifically, the invention is applicable to nonvolatile semiconductor memory devices having such a structure that the control gate electrode is buried in the region between the floating gate electrodes via the inter-gate insulation film.

In claims 2 and 3, the third gate electrode of the selection transistor has an insulation film for stopping siliciding.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
    a semiconductor substrate including a memory cell area and a selection transistor area;
    a first insulation film formed on the semiconductor substrate in the memory cell area;
    a first gate electrode formed on the first insulation film;
    a second insulation film formed on an upper surface and a side surface of the first gate electrode; and
    a second gate electrode formed on the second insulation film,
    wherein the second gate electrode includes a first portion, a second portion, and a third portion, the first portion is located directly above the first gate electrode, the second portion is located on a side of the first portion, and a level of a bottom surface of the second portion is equal to a level of an upper surface of the second insulation film,
    wherein the first and second portions are formed of a silicide, and
    the third portion, which is in contact with the second insulation film formed on the side surface of the first gate electrode, is formed of a silicon.

2. The device according to claim 1, further comprising:
    a selection transistor formed on the semiconductor substrate in the selection transistor area, the selection transistor including a third insulation film formed on the semiconductor substrate, a third gate electrode formed on the third insulation film, a fourth insulation film formed on the third gate electrode, and a fourth gate electrode formed on the third gate electrode, wherein the third gate electrode and the first gate electrode are composed of the same material.

3. The device according to claim 2, wherein the fourth insulation film of the selection transistor has an opening, and a conductor, which connects the third gate electrode and the fourth gate electrode, is formed in the opening.

4. The device according to claim 3, wherein the conductor is formed of a silicon.

5. The device according to claim 3, wherein the conductor is formed of a third silicide.

6. The device according to claim 1, wherein the nonvolatile semiconductor memory device is a NAND-type nonvolatile semiconductor memory device.

7. The device according to claim 1, wherein the nonvolatile semiconductor memory device is a NOR-type nonvolatile semiconductor memory device.

8. The device according to claim 1, wherein a lower surface of the silicide is in contact with an upper surface of the silicon.

9. A nonvolatile semiconductor memory device comprising:
    a semiconductor substrate including a memory cell area and a selection transistor area;
    a plurality of first insulation films formed on element regions which are located in the semiconductor substrate and are separated by a device isolation region, in the memory cell area;
    a plurality of first gate electrodes formed on the first insulation films;
    a second insulation film formed on an upper surface and each side surface of the plurality of first gate electrodes continuously; and
    a plurality of second gate electrodes formed on the second insulation film, wherein first portions of the second gate electrodes that are located directly above the first gate electrodes, and second portions of the second gate electrode, which are located between the first portions of the second gate electrodes, are formed of a silicide, and third portions of the second gate electrode, which are located between the second insulating films formed on the side surfaces of the plurality of the first gate electrodes, are formed of a silicon, and a level of a bottom surface of the second portions of the second gate electrode is equal to a level of an upper surface of the second insulation film directly above the first gate electrodes.

10. The device according to claim 9, wherein the semiconductor substrate includes a selection transistor area, and further comprising, a selection transistor formed on the semiconductor substrate in the selection transistor area, the selection transistor including the third insulation film formed on the semiconductor substrate, a third gate electrode formed on the third insulation film, a fourth insulation film formed on the third gate electrode, and a fourth gate electrode formed on the fourth insulation film, wherein the third gate electrode and the first gate electrode are composed of the same material.

11. The device according to claim 10, wherein the second insulation film of the selection transistor has an opening, and a conductor, which connects the third gate electrode and the forth gate electrode, is formed in the opening.

12. The device according to claim 11, wherein the conductor is formed of a silicon.

13. The device according to claim 11, wherein the conductor is formed of a silicide.

* * * * *